United States Patent [19]
Broich et al.

[11] Patent Number: 4,768,075
[45] Date of Patent: Aug. 30, 1988

[54] POWER SEMICONDUCTOR MODULE

[75] Inventors: Bruno Broich, Baden; Jens Gobrecht, Gebenstorf; Peter Roggwiller, Riedt-Neerach, all of Switzerland

[73] Assignee: BBC Brown, Boveri & Company, Limited, Baden, Switzerland

[21] Appl. No.: 924,739

[22] Filed: Oct. 30, 1986

[30] Foreign Application Priority Data

Nov. 15, 1985 [CH] Switzerland .................. 4897/85

[51] Int. Cl.⁴ .................................... H01C 29/74
[52] U.S. Cl. ........................... 357/38; 357/13; 357/75; 357/79; 357/81; 307/315; 307/318; 307/570; 307/633
[58] Field of Search ............... 357/23.4, 43, 75, 81, 357/79; 307/570, 252 C, 305, 315, 318, 633

[56] References Cited

U.S. PATENT DOCUMENTS

| | | | |
|---|---|---|---|
| 3,935,501 | 1/1976 | Sterbac | 357/75 |
| 4,218,695 | 8/1980 | Egerbacher et al. | 357/75 |
| 4,492,975 | 1/1985 | Yamada et al. | 357/79 |
| 4,514,747 | 4/1985 | Miyata et al. | 357/38 |
| 4,547,686 | 10/1985 | Chen | 307/570 |
| 4,571,815 | 2/1986 | Baliga et al. | 357/22 E |
| 4,639,759 | 1/1987 | Neidig et al. | 357/75 |
| 4,649,416 | 3/1987 | Borkowski et al. | 357/75 |
| 4,651,035 | 3/1987 | Shigekane | 307/570 |
| 4,663,547 | 5/1987 | Baliga et al. | 307/570 |

FOREIGN PATENT DOCUMENTS

| | | | |
|---|---|---|---|
| 0111659 | 6/1984 | European Pat. Off. | |
| 3211975 | 10/1982 | Fed. Rep. of Germany | 357/75 |
| 3336979 | 4/1984 | Fed. Rep. of Germany | |
| 3501985 | 8/1985 | Fed. Rep. of Germany | |
| 3409146 | 9/1985 | Fed. Rep. of Germany | |
| 2529013 | 12/1983 | France | |
| 54-57984 | 5/1979 | Japan | 357/75 |
| 59-215762 | 12/1984 | Japan | 357/75 |

Primary Examiner—Joseph E. Clawson, Jr.
Attorney, Agent, or Firm—Oblon, Fisher, Spivak, McClelland & Maier

[57] ABSTRACT

A power semiconductor module including a cascade circuit of a low-voltage high-current MOSFET and of a bipolar semiconductor element, for example a field-controlled thyristor, GTO thyristor or Darlington transistor, as a hybrid combination. In this manner, it is possible to achieve a construction, which exhibits low induction and which saves space and which at the same time permits efficient cooling of the module.

10 Claims, 1 Drawing Sheet

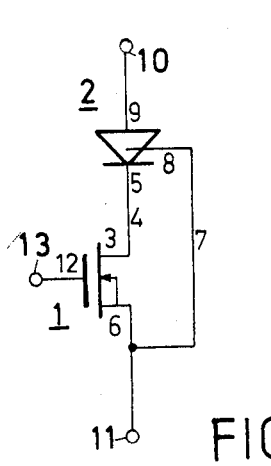
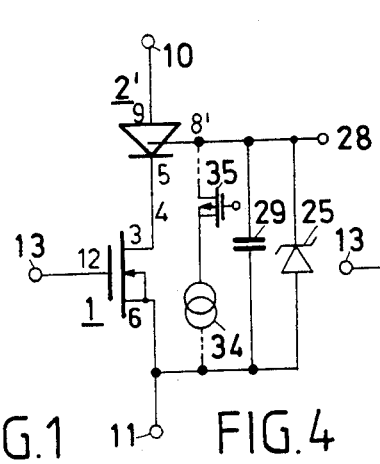
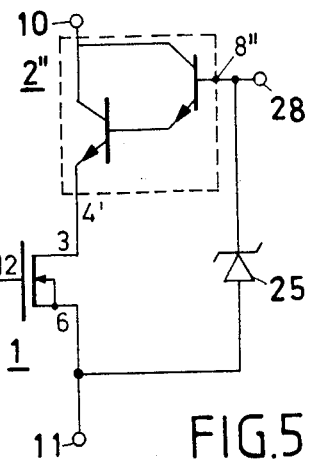
FIG.1  FIG.4  FIG.5
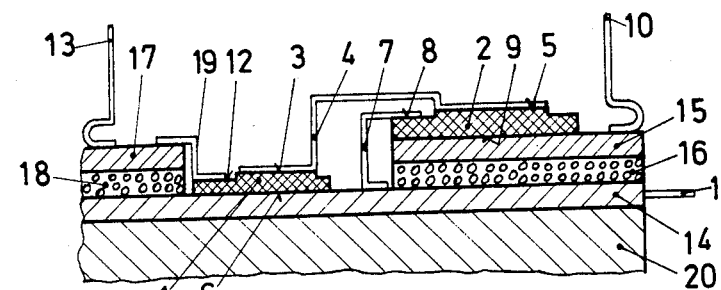
FIG.2
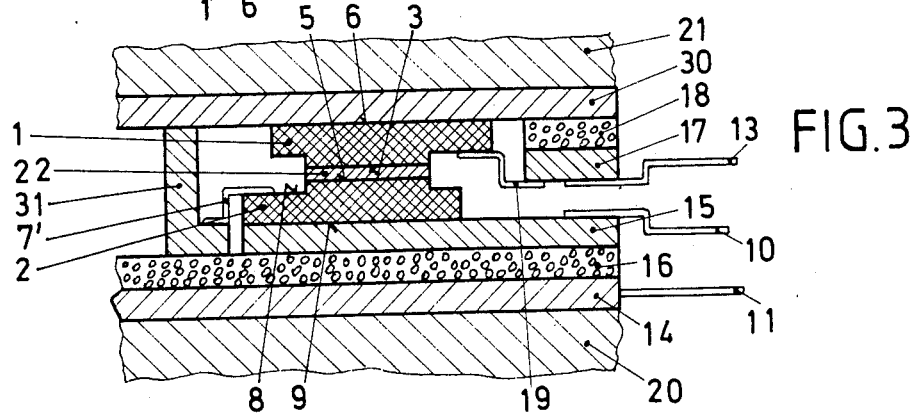
FIG.3
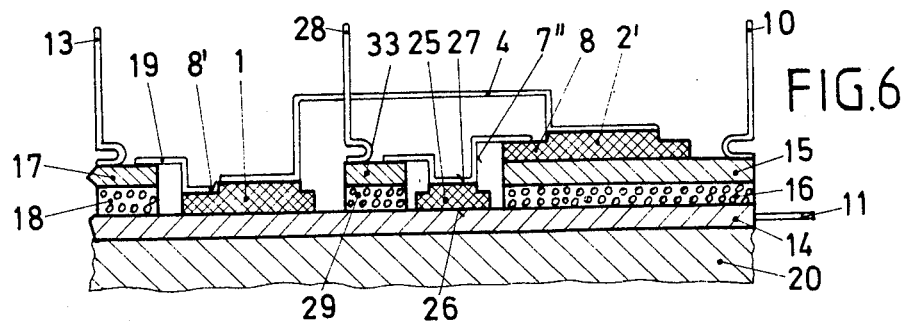
FIG.6

POWER SEMICONDUCTOR MODULE

BACKGROUND OF THE INVENTION

1. Field of the Invention

The invention relates to a power semiconductor module having at least one bipolar semiconductor element and an MOS semiconductor element arranged in a cascade circuit.

2. Discussion of Background

For the drive of bipolar power semiconductor elements, there are known combinations with low-voltage high-current MOSFETs, in which the load current of the bipolar power semiconductor is commutated on de-energization to the drive connection. The most well-known arrangement of this type is the cascade circuit, the fundamental construction and mode of action of which are described, for example, in the German book "Lexikon der Elektronik" (Dictionary of Electronics) Friedrich Vieweg-Sohn Braunschweig/Wiesbaden 1983, pp. 228 and 229. Field-controlled thyristors (FCTh), GTO thyristors or (Darlington) transistors can be employed as a bipolar power semiconductor.

The essential advantages of the cascade circuits consist in that the drive of the switch takes place with low energy consumption by means of the MOS gate of the power MOSFET, and high switching speeds and frequencies can be achieved.

However, the latter requires a compact construction, adapted to the high switching speeds and frequencies, with defined wiring between the components of the cascade.

SUMMARY OF THE INVENTION

Accordingly, the object of this invention, is to provide a power semiconductor module of the initially mentioned type, which module satisfies the requirements above-noted.

The above object is achieved by providing a novel power semiconductor module having at least one bipolar semiconductor element and an MOS semiconductor element cascade connected, wherein the bipolar semiconductor element is contacted directly or via metallic compensating elements with a metalization on a first substrate under the bipolar semiconductor ement. This first substrate is disposed on a first metallic carrier plate, and the MOS semiconductor element is disposed directly beside the bipolar semiconductor element, on the same metal plate or on the surface—facing the bipolar semiconductor element—of a second carrier plate above the bipolar semiconductor element. The electrical connections between the two semiconductor elements are made by direct contacting and/or by contact bridge elements, and at least the surface—remote from the bipolar semiconductor element—of the first carrier plate is contactable with a cooling body.

As a result of the construction, according to the invention, of the module, the relevant parameters essentially determining the thermal and electrical properties of the module are fixed once and for all and can already be optimized at an early stage of the development of the module. The exchange of defective modules is possible without impairment of the overall function.

In a preferred embodiment of the power semiconductor module of the invention, the MOS semiconductor element is disposed directly on the first metallic carrier plate beside the bipolar semiconductor element. The semiconductor components are connected to one another directly via a first contact bridge elemnt and the bipolar semiconductor element is directed to a first principal current terminal of the module. A drive connection of the bipolar semiconductor element is directed to the first carrier plate via a second bridge element disposed below the first bridge element and spaced from the latter, which first carrier plate forms the second principal current terminal of the module. Also, a drive connection of the MOS semiconductor elemnt is directed to a further terminal, the drive terminal of the module.

By the design of the module as claimed in patent claims 2 and 3, it is moreover possible to reliably avoid the shortcomings associated with the cascade circuit of MOS and bipolar semiconductor elements.

It is a disadvantage with the cascade circuit that the MOSFET is connected in series with the bipolar power semiconductor and the switching and transmission losses thereof are added to those of the bipolar power semiconductor. Thus, the attainable switching powers and cycle frequencies are essentially dependent upon the cooling efficiency of the two components. While in the case of bipolar components and chip surface can easily be enlarged and thus the heat which occurs due to energy losses can be distributed over a larger contact surface area, in the case of MOSFETs this is only possible with difficulty, for technological reasons. Typically, power MOSFETs are nowadays smaller than one half $cm^2$, while the bipolar power semiconductor for the same current-carrying capacity is designed to have a surface area of one to two $cm^2$. In view of the fact that both components in the cascade circuit carry the same current, in the case of the smaller MOSFET the power density occurring as a result of energy losses is, as a rule, greater by a factor of 2-3 than in the case of the bipolar component. In order that it should be possible for the circuit to be extended as far as the limit of its switching power, the cooling, in particular, of the MOSFET chip must be designed in a particularly efficient manner.

The module technique, known per se, is particularly well-suited to the hybrid construction of the cascode from bipolar chip and MOS chip. In the module technique, at least two semiconductor chips are mutually insulated as elements of a circuit, and are mounted on the same metallic baseplate. Between the metal baseplate and individual metal contact plates, on which the chips are soldered, there is disposed an insulating ceramic plate. In addition to the functional combination of a plurality of components in a housing, the idea with the module consists in conducting away the heat losses occurring in the case of each element via the ceramic plate into the same metal baseplate and cooling the latter to a sufficient extent. In this sandwich of semiconductor-chip-metal contact plate-ceramic plate-metal baseplate, the ceramic plate forms the greatest thermal resistance. The ceramic plate effects on the one hand the electrical insulation of the semiconductor chips mounted on their metallic contact plates with respect to one another, as well as the electrical insulation of the metal baseplate, which can thus be mounted free from potential on a cooling body.

The problem of heat removal in the case of hybrid combinations of MOS and bipolar components in the module technique is frequently discussed in recent literature. Thus, in the article "Modules with solder contacts for high power applications" by Arno Neidig in Conf. Rec. 19th Ann. Meeting of IEEE Ind. Appl. Soc., Oct. 84, p. 723, it is proposed to replace the formerly conventional aluminum oxide substrates by ones on an aluminum nitride base which exhibit a greater thermal conductivity than the aluminum oxide ceramic, or to integrate a heat pipe into the substrate, in order to conduct away the heat which occurs due to energy losses laterally from the module. However, to date, both technologies have not progressed, from a technical point of view, beyond the experimental stage, and commercial application is not foreseeable.

The further development of the preferred embodiment of the invention, as above described, results in a power semiconductor module which can be produced with the materials and technologies available today and can be cooled effectively.

As a result of the direct mounting of the MOS semiconductor element on the metallic carrier plate, the heat transfer resistance from the MOS element to the baseplate is smaller by an order of magnitude (typically by a factor of 20) than that from the bipolar element to the baseplate aluminum oxide used as ceramic material. In comparison with the bipolar semiconductor element, the MOS semiconductor element is particularly effectively cooled.

A construction exhibiting even lower induction is obtained if the module, is designed in a sandwich construction, the two semiconductor elements being disposed one above the other and their principal current paths thus being in series.

BRIEF DESCRIPTION OF THE DRAWINGS

A more complete appreciation of the invention and many of the attendant advantages thereof will be readily obtained as the same becomes better understood by reference to the following detailed description when considered in connection with the accompanying drawings, wherein:

FIG. 1 is a circuit diagram of the cascade circuit of an MOS semiconductor element and a field-controlled thyristor, FIG. 2 is a schematic circuit diagram of the cascade circuit according to FIG. 1 in hybrid technology with unilateral cooling, FIG. 3 is a schematic circuit diagram of the cascade circuit according to FIG. 1 in hybrid technology with bilateral cooling, FIG. 4 is a schematic sectional view of the cascade circuit of an MOS semiconductor element and of a GTO thyristor, FIG. 5 is a schematic sectional view of the cascade circuit of an MOS semiconductor element and of a Darlington transistor, FIG. 6 is a schematic sectional view of the schematic construction of the cascade according to FIG. 4 or 5 in hybrid technology with unilateral cooling.

DESCRIPTION OF THE PREFERRED EMBODIMENTS

Referring now to the drawings, wherein like reference numerals designate identical or corresponding parts throughout the several views, in the circuit according to FIG. 1, an n channel power MOS transistor 1 and a field-controlled thyristor (FCTh) 2 are connected in cascade. For this purpose, the source connection 3 of the MOS transistor 1 is connected via a first connecting line 4 to the cathode 5 of the thyristor 2, and the drain connection 6 of the MOS transistor 1 via a second connecting line 7 to the gate 8 of the thyristor 2. The anode 9 of the thyristor 2 and the drain connection 6 of the MOS transistor 1 form the two principal or high-current terminals 10, 11, and the gate connection 12 of the MOS transistor 1 forms the drive terminal 13 of the cascade.

In the exemplary, practical embodiment of a thyristor-MOS-transistor cascade in module technology according to FIG. 2, the two semiconductor chips (MOS transistor 1, FCTh thyristor 2) as well as their associated connections are provided with the same reference symbols as in FIG. 1 and are disposed adjacent one another on a metallic carrier plate 14. The drain contact 6 of the MOS transistor 1 is directly connected to the metallic carrier plate 14, and is preferably soldered to the latter. The thyristor 2 is soldered by its anode contact 9, with the interposition of a metal contact plate 15, to a metalized ceramic plate 16. This ceramic plate 16 is, for its part, soldered to the carrier plate 14. The connecting lines 4 and 7 between source 3 and cathode 5 and between drain 6 and gate 8 respectively are constructed as metal strips or contact bridge elements 4 and 7 respectively. In this arrangement, the metal strip 7 leads over the shortest path from the gate contact 8 on the carrier plate 14 in the intermediate space between the two chips 1 and 2. Likewise over the shortest path—with the maintenance of the required insulation spacing—the metal strip 4 connects the cathode contact 8 of the thyristor 2 to the source contact 3 of the MOS transistor 1.

The two metal strips 4 and 7 form a conductive loop, which can be constructed, in the arrangement shown, with particularly low induction, that is with a small surface cross-section. The construction exhibiting low induction is particularly important in a cascade circuit, so that switching currents which vary rapidly with time do not induce any excessively large overvoltages in the conductive loop and thereby destroy components.

The drive terminal 13 of the cascade is not directly connected at the gate contact 12 of the MOS transistor 1. Instead, drive terminal 13 is connected a metal plate 17, which is soldered via an insulating plate 18, for example made of $Al_2O_3$ ceramic, to the carrier plate 14. The electrical connection between gate contact 12 and metal plate 17 is made by a contact bridge element 19. The carrier plate 14 and the contact plate 15 form the high-current terminals 10, 11 of the cascade or of the module. In this connection, the terminals 10, 11 are constructed as connecting lugs, which are soldered to the contact plate 15 or the carrier plate 14.

The module can, as a whole, be secured over a large area onto a cooling body 20; in this arrangement, the cooling body 20 can also form the other high-current terminal 11 of the module.

A construction exhibiting substantially lower induction, of a cascode circuit in hybrid technology is achieved if, according to FIG. 3, the MOS semiconductor element 1 is directly electrically connected to the bipolar semiconductor element 2. In FIG. 3, the same parts as in FIG. 2 are provided with the same reference symbols. The circuit achieved with the sandwich arrangement according to FIG. 3 corresponds to that of FIG. 1.

As in FIG. 2, the bipolar semiconductor element 2 is secured by its anode contact 9, with the interposition of a metal contact plate 15 and a metalized ceramic plate 16, on the lower carrier plate 14. The source contact 3 of the MOS semiconductor element 1 is directly soldered to the cathode contact 5 of the bipolar semiconductor element 2, or is alloyed thereto or cemented thereto with a conductive cement (intermediate layer 22 in FIG. 3). Where, for design reasons, a greater spacing must be available between the two semiconductor elements 1, 2, this layer 22 is replaced by an appropriately thick intermediate plate of metal or silicon.

The drain contact 6 of the MOS semiconductor element 1 is directly connected to a second metalic carrier plate 30.

Both carrier plates 14 and 30 are connected over a large area to cooling bodies 20, 21. The high-current terminals 10, 11 and the drive terminal 13 of the cascade are guided out laterally, in which arrangement the contacting of the drive terminal is accomplished in a manner similar to FIG. 2 by means of contact bridge element 19 and metal plate 17. The connection, required according to the circuit in accordance with FIG. 1, between the gate contact 8 of the bipolar semiconductor element 2 and the drain connection 6 of the MOS semiconductor element 1 is made via a contact bridge element 7', which leads to a contact post 31, which is disposed between the ceramic plate 16 and the second carrier plate 30 and serves at the same time for the distancing of the sandwich.

The cathode region and the source region of both chips are advantageously designed in such a manner that the surfaces can be connected well to one another with a material fit, and the gate regions do not come to be disposed one above the other, so that metalic connecting terminals can be continued laterally from the gates. For this purpose, it can likewise be necessary to increase the spacing between the chips by the thickness of the electrically conductive intermediate layer 22.

In both structures, according to the invention, corresponding to FIGS. 2 and 3, the module can contain not only the MOS and the bipolar chip but also additional components, which are electrically connected to one another. In the bilaterally coolable structure according to FIG. 3, more complex circuits containing several components can be connected to one another especially efficiently and in a space-saving manner. Such sandwich modules are described, for example, in German Offenlegungsschrift No. 3,406,528.

If the cascade is constructed according to FIG. 4 with a GTO thyristor or a Darlington transistor (FIG. 5), it is necessary to provide an additional drive connection 28 at the gate 8' of the GTO thyristor 2' or driver connection 8" of the Darlington transistor 2", which is connected via a Zener diode 25 to the terminal 11. A module construction according to the invention is schematically represented in FIG. 6. Naturally, the semiconductor elements do not need to be disposed exclusively one behind the other, but can also be disposed side by side, in order on the one hand to keep the surface area small and on the other hand to dispose the bridging elements in a favorable manner.

Thus, in the module according to FIG. 6, there is disposed between the MOS semiconductor component 1 and the bipolar semiconductor element 2', in this instance a GTO thyristor, a Zener diode 25 with its anode connection 26 directly on the carrier plate 14, which Zener diode is connected to the cathode side to the gate connection 8' of the GTO thyristor 2' via a contact bridge element 7". This contact bridge element leads at the same time to the additional drive connection 28 of the cascade. The condenser 29 (FIG. 4), which is connected in parallel with the Zener diode 25, is likewise integrated, in hybrid technology, into the module, and is illustrated as a dielectric layer 29 between a metal plate 33, which carries the terminal 28, and the carrier plate 14.

With the circuit according to FIG. 4 or the embodiment in hybrid technology according to FIG. 6, it is possible to dispense with an otherwise necessary active component, for example a current source 34 in series with a p-channel MOS transistor 35 (indicated in broken lines in FIG. 4). Both the energising process and also the de-energising process may be controlled via the gate 12 of the MOS semiconductor element 1 in the load circuit. The gate current required for firing the GTO thyristor 2' is delivered by the capacitor 29, as soon as the MOS transistor 1 conducts. If the load current is switched off as a result of blocking of the MOS transistor 1, then there flows for a brief period of time a negative gate current, which approximately corresponds to the previous load current, into the capacitor 29, so that sufficient charge is again available for the next energizing process. If no further firing occurs during a relatively long period of time, when discharge of the capacitor can be prevented if it is assured that the leakage current of Zener diode, MOS transistor and capacitor is smaller than that of the GTO thyristor. In the present invention, the switching-off energy placed in intermediate storage in the capacitor is employed again for energization of the GTO.

If GTO thyristors having a finely structured control zone are employed, the indicated circuit may be constructed in a particularly reliable manner, since, even at high load currents, these components can be de-energised with a de-energization amplification of ~1.

Obviously, numerous modifications and variations of the present invention are possible in light of the above teachings. It is therefore to be understood that within the scope of the appended claims, the invention may be practiced otherwise than as specifically described herein.

What is claimed as new and desired to be secured by Letters Patent of the United States is:

1. A semiconductor power module for current control with first and second main terminals and at least one control terminal, comprising:

a controllable bipolar power semiconductor device having an anode, a cathode and a first gate;

a power MOS field-effect transistor having a source, a drain and a second gate, said bipolar power semiconductor device connected in series with said power MOS field-effect transistor with said cathode connected to said source, said first gate connected to said drain, and said anode, said drain and said second gate connected to said first and second main terminals and said at least one control terminal, respectively;

a metallic carrier plate having first and second surfaces;

an insulating substrate mounted on and covering only part of said first surface of said carrier plate, said insulating substrate having a metallized surface on which said bipolar power semiconductor device is mounted and to which said bipolar power semiconductor is electrically connected;

said power MOS field-effect transistor disposed beside said bipolar power semiconductor device directly on said metallic carrier plate;

contact bridge element means for making electrical connections between said bipolar power semiconductor device and said power MOS field-effect transistor; and said second surface of said metallic carrier plate provided to thermally contact cooling means;

said contact bridge element means comprising a first contact bridge element for connecting said cathode and said source directly to one another;

said anode of said bipolar power semiconductor device directly connected to said first main terminal of said module;

said contact bridge element means comprising a second contact bridge element disposed below said first contact bridge element and spaced apart from said first contact bridge element, said second contact bridge element connecting said first gate of said bipolar power semiconductor device to said carrier plate, said carrier plate serving as said second main terminal of said module; and said second gate of said power MOS field-effect transistor connected to said control terminal of said module.

2. A semiconductor power module according to claim 1, comprising:

a Zener diode connecting said first gate of said bipolar power semiconductor device to said drain of said power MOS field-effect transistor.

3. A semiconductor power module according to claim 2, wherein said controllable bipolar power semiconductor device comprises:

a Darlington transistor having a base connected to a further control terminal of said module.

4. A semiconductor power module according to claim 2, wherein said controllable bipolr power semiconductor device comprises:

a field-controlled thyristor (FCT) having a gate connected to a further control terminal of said module.

5. A semiconductor power module for current control with first and second main terminals and at least one control terminal, comprising:

a controllable bipolar power semiconductor device having an anode, a cathode and a first gate;

a power MOS field-effect transistor having a source, a drain and a second gate, said bipolar power semiconductor device connected in series with said power MOS field-effect transistor, with said cathode connected to said source, said first gate connected to said drain, and said anode, said drain and said second gate connected to said first and second main terminals and said at least one control terminal, respectively;

first and second opposed metallic carrier plates each having first and second surfaces arranged with the first surfaces thereof facing each other;

an insulating substrate mounted on said first surface of said first carrier plate, said insulating substrate having a metallized surface on which said bipolar power semiconductor device is mounted and to which said bipolar power semiconductor device is electrically connected;

said power MOS field-effect transistor mounted on and electrically connected to said first surface of said second carrier plate opposite said bipolar power semiconductor device, said power MOS field-effect transistor directly contacting said bipolar power semiconductor device; and said second surfaces of said first and second carrier plates provided to thermally contact cooling means.

6. A semiconductor power module according to claim 5, further comprising:

said cathode and said source directly connected to one another due to said direct contacting between said power MOS field-effect transistor and said bipolar power semiconductor device;

said anode of said bipolar power semiconductor device directly connected to said first main terminal and said module;

a conductive contact post connected to said second carrier plate and mounted between said insulating substrate and said second carrier plate;

a contact bridge element for connecting said first gate of said bipolar power semiconductor device to said contact post and thereby making electrical connection between said first gate of said bipolar power semiconductor element, and said drain of said power MOS field-effect transistor; and said second gate of said power MOS field-effect transistor connected to said control signal of said module.

7. A semiconductor power module according to claim 6, wherein said first and second carrier plates are separated by a distance substantially equal to the sum of thickness of said power MOS field-effect transistor, said bipolar power semiconductor device and said insulating substrate.

8. A semiconductor power module according to claim 7, wherein said controllable bipolar power semiconductor device comprises:

a thyristor having a cathode directly connected via an electrically conductive intermediate layer to said source of said power MOS field-effect transistor.

9. A semiconductor power module as claimed in claim 7, wherein said terminals of said module are directed out laterally between said carrier plates.

10. A semiconductor power module as claimed in claim 8, wherein said terminals of said module are directed out laterally between said carrier plates.

* * * * *